United States Patent [19]

Torii et al.

[11] Patent Number: 4,975,324

[45] Date of Patent: Dec. 4, 1990

[54] PERPENDICULAR MAGNETIC FILM OF SPINEL TYPE IRON OXIDE COMPOUND AND ITS MANUFACTURING PROCESS

[75] Inventors: Hideo Torii, Higashiosaka; Eiji Fujii, Osaka; Masaki Aoki, Minou; Nobuyuki Aoki, Hirakata; Keiichi Ochiai, Hirakata, all of Japan

[73] Assignee: Matsushita Electric Industrial Co., Ltd., Osaka, Japan

[21] Appl. No.: 110,852

[22] Filed: Oct. 21, 1987

[30] Foreign Application Priority Data

Oct. 21, 1986 [JP] Japan .................... 61-249991
Jan. 22, 1987 [JP] Japan .................... 62-12900

[51] Int. Cl.$^5$ .......................................... G11B 23/00
[52] U.S. Cl. ................................. 428/329; 427/38; 427/128; 428/694; 428/900
[58] Field of Search .................. 428/329, 694, 900; 427/38, 128; 204/192.2; 252/62.56

[56] References Cited

U.S. PATENT DOCUMENTS

| | | | |
|---|---|---|---|
| 3,822,210 | 7/1974 | Iwase et al. | 252/62.56 |
| 4,232,071 | 11/1980 | Terada et al. | 428/694 |
| 4,239,835 | 12/1980 | Iijima et al. | 428/457 |
| 4,255,492 | 3/1981 | Audran et al. | 428/694 |
| 4,367,263 | 1/1983 | Kawahara et al. | 428/694 |
| 4,414,271 | 11/1983 | Kitamoto et al. | 428/694 |
| 4,544,612 | 10/1985 | Ishii et al. | 428/900 |
| 4,726,988 | 2/1988 | Oka et al. | 428/900 |

FOREIGN PATENT DOCUMENTS 0169928 2/1986 European Pat. Off. .

OTHER PUBLICATIONS

Tagami et al., IEEE Trans. Magn., MAG-17-(6), 3199-3201 (Nov. 1981).
"Patent Abstracts of Japan", vol. 10 (65), E-388, p. 150, Mar. 14, 1986 (JP-A-60 217 619).
Langlet et al., Conf. Proceedings, Magnet. Thin Films (PAP. SYMP. 10), p. 110 (56/E-MRS), Jun. 1986.

*Primary Examiner*—Paul J. Thibodeau
*Attorney, Agent, or Firm*—Wenderoth, Lind & Ponack

[57] ABSTRACT

Disclosed herein is a perpendicular magnetic film of spinel type iron oxide formed on a surface of a base substrate in the form of columnar grains which are densely arranged perpendicularly to the surface of the base substrate. A vapor of an organic iron compound or a mixed vapor consisting of the organic iron compound vapor and a vapor of an organic metal compound different from the organic iron compound is added with oxygen to obtain a mixed gas. The mixed gas is subjected to chemical vapor deposition on the substrate at low temperature, at reduced pressure in plasma, thereby to obtain the perpendicular magnetic film.

7 Claims, 2 Drawing Sheets

PERPENDICULAR MAGNETIC FILM OF SPINEL TYPE IRON OXIDE COMPOUND AND ITS MANUFACTURING PROCESS

BACKGROUND OF THE INVENTION

1. Field of the Invention

The present invention relates to a perpendicular magnetic thin film and a manufacturing process thereof. The perpendicular magnetic thin film is used for the media of a perpendicular magnetic recording method or magneto-optic recording method which enables ultra high density recording and playback in the field of high density memory such as magnetic disks or digital recording for computer memory, video tape recorder, digital recording audio tape recorder, and magneto-optic disks.

2. Description of the Prior Art

Recently, the memory related field tends toward recording with higher density and digital recording. In the field of magnetic recording by means of a magnetic head which accounts for the most part of the memory field, the in-plane magnetic recording method in which the magnetizing direction is in a plane of magnetic recording medium has been used conventionally. However, there is a limit to the improvement of recording density by this method. On the other hand, there emerged a perpendicular magnetic recording method to provide ultra high density recording method, which employs a magnetic recording medium having an axis of easy magnetization in a perpendicular direction to the head travelling surface of the magnetic recording medium. (For example, S. IWASAKI, Y. NAKAYAMA; "An analysis for the magnetization mode for high density magnetic recording." IEEE. Trans. Magn., MAG-13-(5), 1272 (1977)). That is to say, in order to realize this ultra high density recording method, a perpendicular magnetic film is indispensable as a magnetic recording medium material.

On the other hand, active studies have been conventionally continued to develop media which use continuous thin film of magnetic material for the reason that they are more suitable to the ultra high density magnetic recording medium than the coat-type media, and the vacuum vapor deposition method or the sputtering method has been mainly used as a manufacturing process of the continuous thin film of magnetic material. As a material, thin film of Co-Cr alloy in particular, which is easily made into the above-mentioned perpendicular magnetic film, has been studied by a very large number of researchers as a material potentially usable for a medium for the above-mentioned perpendicular magnetic recording. (For example, K. Ouchi: "Co-Cr recording film with perpendicular magnetic anisotropy", IEEE. Trans. Magn. MAG-14(5) 849 (1978)).

However, it was found that many problems are involved with environmental resistance such for example as the corrosion of the magnetic film caused by moisture in air. Experiments have been carried out for improved corrosion resistance by such means as coating the surface of the magnetic film with a non-magnetic oxide layer of different type. However, a new problem has emerged in that the manufacturing process of the magnetic media become complicated. There are many other problems to be solved.

As compared to the above, $Fe_3O_4$ (Magnetite) or $\gamma$-$Fe_2O_3$ (Maghemite) which is the iron oxide having spinel type oxide crystal structure is by itself a magnetic oxide. The $\gamma$-$Fe_2O_3$ in particular has very extremely excellent environmental resistance and is practically used as raw material magnetic powder for most of the coat-type magnetic recording media such as magnetic tapes and magnetic disks. For this reason, studies have been conducted in an attempt to use these spinel type iron oxides as magnetic films of the magnetic thin film media. Although the continuous magnetic thin film used for media of conventional in-plane magnetic recording method was materialized, the perpendicular magnetic film required for the media of perpendicular magnetic recording method of the above-mentioned ultra high density magnetic recording method has not been materialized.

For the purpose of reference, a typical manufacturing process of the magnetic thin film of the media for the spinel type iron oxide in-plane magnetic recording method will hereafter be described.

Conventionally, the $\gamma$-$Fe_2O_3$ thin film used to be manufactured by the sputtering method. By means of the reaction sputtering method in which a metallic iron target is used and sputtering is carried out while oxygen is being flowed generally, a thin film of $\alpha$-$Fe_2O_3$ (alpha iron oxide) having a non-magnetic corundum type crystal structure is manufactured first. The thin film is reduced in a current of hydrogen and caused to be transformed into $Fe_3O_4$ having a spinel type crystal structure, which is further caused to be oxidized slightly to finally produce a continuous film of $\gamma$-$Fe_2O_3$ having the same spinel type crystal structure (for example, J. K. Howard; "Thin films for magnetic recording technology; A review" J. Vac. Sci. Technol. A. 4, 1986).

In the above-mentioned manufacturing of continuous film of $\gamma$-$Fe_2O_3$ by means of sputtering method, a metallic iron is used as a target material, a continuous film of $\alpha$-$Fe_2O_3$ is first formed by accomplishing the reaction sputtering in a chamber where a small quantity of oxygen is introduced, the film is reduced to be changed into an $Fe_3O_4$ film having different crystal structure, and the $Fe_3O_4$ film is further caused to be oxidized slowly to be changed into a continuous film of $\gamma$-$Fe_2O_3$, thereby a continuous magnetic film of $\gamma$-$Fe_2O_3$ is produced. Therefore, fine cracks are likely to be generated over the film surface due to a large change in volume caused during a changing process of $\alpha$-$Fe_2O_3 \rightarrow Fe_3O_4 \rightarrow \gamma$-$Fe_2O_3$, resulting in poor film surface quality causing the film to be susceptible to defects. Further, since the film consists of fine a polycrystalline structure, the efficiency of magnetic characteristics is lowered as compared with a single crystal film in which a certain regular crystal plane is in a specific orientation. Furthermore, complicated and numerous processes are involved in manufacturing. That is, there are many problems to be solved.

As a manufacturing process to remove these defects, a method is being studied wherein the powder of spinel type iron oxide is pressed and formed into a target material, so that the spinel type iron oxide thin film is directly obtained by sputtering method (for example, Y, Hoshi, M. Naoe; Telecommunication Society Report, Vol. 85, No. 87, p. 9, 1985 in Japanese). In this process, although a spinel type iron oxide magnetic film of oriented crystal plane can be obtained by selecting a substrate material, the perpendicular magnetic film is not obtained. In addition, this process has a defect such as slow film forming speed and cannot be said to be a manufacturing process suitable for mass production.

On the other hand, an optical recording method which uses a laser beam is available as ultra high density recording method. The magneto-optic recording method is the most prospective rewritable method among the optical recording methods. In the magneto-optic recording method, a laser beam is used to heat a part of a magnetic spin which has previously been oriented in one direction perpendicularly to the magnetic thin film surface of a medium so that the magnetic spin of the laser beam irradiated film surface is magnetized and inverted thereby to record a bit of a signal. The recorded signal is read by a light by utilizing the property of light that the rotational direction of the polarized light plane becomes different depending on the direction of the magnetic spin. Therefore, a perpendicular magnetic film becomes inevitably necessary for the magnetic film of the media of the magneto-optic recording method.

Manganese bismuth (MnBi) alloy was a material of the magneto-optical memory used in the first stage, but had defects such as phase transfer, thermal instability, susceptible to oxidation, difficulty to obtain uniform film of small grain, and large noise of media. Then there emerged a film of RE-TM (rare earth-transition metal) amorphous alloy such as Gd-Co, Tb-Fe and Gd-Fe. These alloy films are normally manufactured by the vacuum deposition method, or sputtering method. The RE-TM alloy features the fact that signal recording with a large signal to noise ratio is achieved by selecting its composition, but it is oxidized, corroded and deteriorated at high temperature and under high humidity because it is a metallic film. This defect is deemed one of the large problems of this method (for example, S. Uchiyama "Magneto-Optical Recording", Surface Science, Vol. 8, No. 2, P. 2, 1987 in Japanese).

The material which is attracting attention as a material to solve this defect is an oxide type perpendicular magnetic film which has good magneto-optical characteristics. This film is a spinel type iron oxide thin film, that is, a cobalt ferrite thin film of which a part of iron ion in the composition is substituted by cobalt ion.

As described previously, a perpendicular magnetic film of $Fe_3O_4$ or $\gamma$-$Fe_2O_3$ has not been realized yet, but it is possible to manufacture the perpendicular magnetic thin film of cobalt substituted spinel type iron oxide which can be used for magneto-optic recording media. This thin film can be manufactured by a manufacturing process to be described below and is being put to use, but it is currently difficult to obtain a perfect perpendicular magnetic film of low media noise.

Two manufacturing processes are available to produce the above-mentioned perpendicular magnetic film of cobalt substituted spinel type iron oxide for the magneto-optic recording method.

One process is the sputtering method (for example, M. Gomi, T. Yasuhara and M. Abe, "Sputter-Deposition of Co Gr Ferrite Thin Film for Magneto-Optic Memory", Japan Applied Magnetism Society Magn., Vol. 9, No. 2, 133, 1985 in Japanese). As a target, a sintered spinel type iron oxide material containing cobalt is used to manufacture a film under $10^{-2}$ to $10^{-3}$ Torr vacuum and at over 350° C. substrate temperature. In the thus obtained film the direction $<111>$ that is different from the axis of easy magnetization of the cobalt substituted spinel type iron oxide is oriented preferentially. When the produced film is cooled to the room temperature, stress is applied to the film due to the difference in the ratio of thermal expansion between the base substrate and the produced film, causing the magnetic spin of the produced film to be easily directed perpendicularly with respect to the surface of the produced film by the effect of stress-caused magnetic anisotropy; thereby a film having a tendency towards perpendicularly is obtained.

However, because the target is an oxide, such problems still remain that the growth of the sputtered film is not fast as that of the metallic target, it is difficult to obtain a uniform film of large area, all being related to the manufacturing of perpendicular magnetic films for magneto-optic recording media.

The other process is to manufacture a film by means of the solution spray-dry pyrolysis method (for example, J. W. D. Martens & A. B. Voermans: "Cobalt Ferrite Thin Films for Magneto-Optical Recording" IEEE Trans. Magn., MAG-29(5), 1007, (1984)). In this method, a dilute alcohol solution of iron nitrate and cobalt nitrate is used as a raw material, a very thin coated film is produced on a base substrate by using the Spinner method, the coated film is dried at a temperature of about 350° C., similar coated films of greater thickness are further formed again on the same substrate by repeating 50 to 60 cycles of film formation and drying processes, and this thick coated film is burned at a temperature of over 600° C. to obtain a perpendicular magnetic film of cobalt substituted spinel type iron oxide similar to one as described above. This method also utilizes the difference of the thermal expansion ratio between the base substrate and the produced film to realize the film having a tendency to the perpendicular magnetic film by the effect of stress-caused magnetic anisotropy. Furthermore, because this method is capable of providing a film which is preferentially oriented into the $<100>$ direction which is the axis of easy magnetization, this method is excellent in forming a film having a tendency to perpendicular magnetic film through the coating and burning processes, and has the merit of obtaining a uniform film over a large area.

However, because many repeated processes of coating and drying are necessary, a burning temperature as high as 600° C. or over requires materials of excellent heat resistance for the base substrate, and since the film is produced by burning, the size and shape of grains are not uniform, which easily causes the media noise.

SUMMARY OF THE INVENTION

As described above, as a high density recording media material, realization of a spinel type iron oxide perpendicular magnetic film has been expected, but to date, except for some thin films of cobalt substituted spinel type iron oxide, no spinel type iron oxide perpendicular magnetic film has been realized.

An object of the present invention is to provide not only the cobalt substituted spinel type iron oxide but also various kinds of perpendicular magnetic films of spinel type iron oxide, and another object is to provide a manufacturing process by which a perpendicular magnetic film according to the present invention is uniformly formed on a large area of substrate made of a material having low heat resistance such as aluminum, plastics or glass of low melting point.

In order to accomplish the above objects, the present invention provides a perpendicular magnetic film of spinel type iron oxide having a structure in which columnar grains are densely arranged perpendicularly to a surface of base substrate, wherein the ratio of diameter to height of each columnar grain is 1:6 or more, and the diameter is at most 450 Å.

In a case that the growth direction (height-wise direction) of respective columnar grains of the film agrees with the direction of the axis of easy magnetization of the spinel type iron oxide, for example, in case the film is the spinel type iron oxide of $Fe_3O_4$ (Magnetite) or $\gamma$-$Fe_2O_3$ (Maghemite) and the direction <111> of the film is preferentially oriented, or in case the film is $Co_xFe_{3-x}O_4$ ($0.1 < x \leq 1$) of cobalt substituted spinel type iron oxide or $Co_xCr_yFe_{3-x-y}O_4$ ($0.1 < x \leq 1, 0 < y \leq 1$) of cobalt-chrome substituted spinel type iron oxide whose direction <100> is preferentially oriented, the ratio of diameter and height of each columnar grain is 1:6 or more and the column diameter is at most 550 Å.

In order to realize the perpendicular magnetic film of the spinel type iron oxide having such a film structure as above, it is required to form the film by controlled conditions such that the sizes of the columnar grains are uniform and so that the column diameter of each of the columnar grains does not grow large. Furthermore, it is preferable to control the crystal orientation of the produced film so that the direction of the growing crystal axis of the columnar grains agrees with the direction of the axis of easy magnetization.

In the manufacturing process to accomplish these requirements according to the present invention, a vapor produced by heating and vaporizing an organic iron compound or a mixed vapor of this vapor and a vapor produced by heating and vaporizing a different kind of metallic compound is used as a raw material gas, oxygen is selected as a reaction gas, and the mixed gas of the raw material gas and the reaction gas is subjected to plasma excitation to cause chemical vapor deposition (CVD) on a base substrate which is held at a temperature range from the room temperature up to 300° C., whereby columnar grains of small column diameter are caused to grow in a perpendicular direction to the surface of the base substrate and are arranged densely, thereby producing the perpendicular magnetic film of the spinel type iron oxide compound having a film structure whose specific crystallographic planes are oriented preferentially.

In the manufacturing process according to the present invention, used as the organic iron compound are $\beta$-diketone iron compounds represented by iron (III) trifluoroacetylacetonate ($Fe(CH_3COCHCOCF_3)_3$), iron (III) hexafluoroacetylacetonate ($Fe(CF_3COCHCOCF_3)_3$) and iron (III) dipivaloylmethane chelate ($Fe(((CH_3)_3COCHOC(CH_3)_3)_3$), and iron cyclopentadienyl compound such as ferrocene derivative represented by ferrocene ($Fe(C_5H_5)_2$) and vinyl ferrocene.

Further, in the manufacturing process according to the present invention, when manufacturing a perpendicular magnetic film of cobalt substituted spinel type iron oxide, a vapor of organic cobalt compound such as $\beta$-diketone cobalt complex represented by cobalt acetylacetonate ($Co(CH_3COCHCOCH_3)_3$) or cyclopentadienyl compound represented by cobaltcen and a vapor of the above-mentioned organic iron compound are mixed and used as the raw material gas.

Likewise, when manufacturing a perpendicular magnetic film of nickel substituted spinel type iron oxide, instead of the organic cobalt compound, an organic nickel compound such as $\beta$-diketone nickel complex represented by nickel acetylacetonate ($Ni(CH_3COCHCOCH_3)_2$ is used. When manufacturing a perpendicular magnetic film of manganese substituted spinel type iron oxide, instead of the above-mentioned organic cobalt compound, an organic manganese compound such as $\beta$-diketone manganese complex represented by manganese acetylacetonate ($Mn(CH_3COCHCOCH_3)_2$) is used. When manufacturing a perpendicular magnetic film of zinc substituted spinel type iron oxide, instead of the above-mentioned organic cobalt compound, an organic zinc compound such as $\beta$-diketone zinc complex represented by zinc acetylacetonate ($Zn(CH_3COCHCOCH_3)_2$) is used.

Generally, in the chemical vapor deposition method (CVD method) (which causes decomposition and deposit by normal heat), the film forming speed can be increased by flowing a large quantity of the raw material gas and reaction gas into a reaction chamber at high speed, and high vacuum is not required differently from the vacuum deposition method and the sputtering method which are other film forming methods generally used. That is to say, the film manufacturing process according to the present invention is suitable for mass production.

In the CVD method according to the present invention, by exciting the raw material gas by means of plasma during film forming, the raw material gas and atmospheric gas are decomposed, in the plasma, into active chemical species such as radicals or ions which are effective to cause chemical reaction at low temperature, and the produced chemical species react each other to be deposited as a stable compound film (in the case of the present invention, as a spinel type iron oxide compound film). As stated above, because active chemical species can be generated in large quantity even at low temperature by the plasma excitation, film forming becomes possible at a low temperature which cannot be expected in the ordinary CVD method.

Because the manufacturing process according to the present invention is the above-mentioned manufacturing process, by selecting the ratio of the flow rate of the vapor of the raw material gas produced by organic metallic compound and the flow rate of the oxygen used as the reaction gas or by selecting conditions such as power of plasma generating high frequency source used for excitation, it becomes possible to form a thin film of spinel type iron oxide in one process. Moreover, because it is easy to produce a uniform film during film forming, the produced film can be easily made into an aggregate film having columnar grains of uniform size, and because the low temperature film forming is possible, the growth of the columnar grains can be restricted and the size of the column diameter can be controlled to be small.

Furthermore, by selecting the kind of substrate and by controlling the ratio of the flow rate of the raw material gas and reaction gas (oxygen) or the degree of vacuum in the reaction chamber or the quantity of inactive gas used to introduce these gases into the reaction chamber, it becomes possible to form a film whose specific crystal axis is preferentially oriented and to exercise control so that the preferred orientation is caused to agree with the direction of the axis of easy magnetization.

As described above, it is possible to effectively manufacture a perpendicular magnetic film of the present invention by means of the above manufacturing method.

Moreover, by employing the manufacturing method according to the present invention, the $\gamma$-$Fe_2O_3$ film which is a kind of spinel type iron oxide can be formed in one process and, therefore, this manufacturing method solves a problem wherein micro cracks are generated on the film surface caused by a change in volume or a change in crystal structure when manufacturing the film by metamorphosing from $\alpha$-$Fe_2O_3$ in the conventional method. The above manufacturing method also solves a problem wherein many processes are required for the metamorphosis of $\alpha$-$Fe_2O_3$ to $Fe_3O_4$ to $\gamma$-$Fe_2O_3$ in the conventional method.

Still furthermore, because the chemical vapor deposition is accomplished by plasma excitation, a crystalline thin film can be formed at a relative by low temperature and it becomes unnecessary to heat the base substrate at a high temperature as in the case of film forming by the conventional chemical vapor deposition method, which do not use plasma excitation. In addition, because a base substrate material whose quality is changed when heated at high temperature can also be used as a base structure, the selection range of the kind of substrate material can be expanded. Therefore, cost reduction of magnetic recording media can be achieved by using substrates made of inexpensive materials.

On the other hand, with respect to the cobalt substituted spinel type iron oxide ($CoFe_{3-x}O_4$) which is regarded as a promising material for iron oxide magneto-optic recording media, if the perpendicular magnetic field of the present invention is used, then, the film is structured with uniformly aggregated columnar grains having a fine column diameter. Therefore, when a magneto-optic recording medium is manufactured by using the film of the invention, the possibility of occurrence of media noise which would occur during signal reproducing due to large or not-uniform sizes of the grains.

BRIEF DESCRIPTION OF THE INVENTION

FIG. 4 is a diagram showing the surface of the perpendicular magnetic film of the same compound, $Fe_3O_4$ of.

DESCRIPTION OF THE PREFERRED EMBODIMENTS

Figure 1:
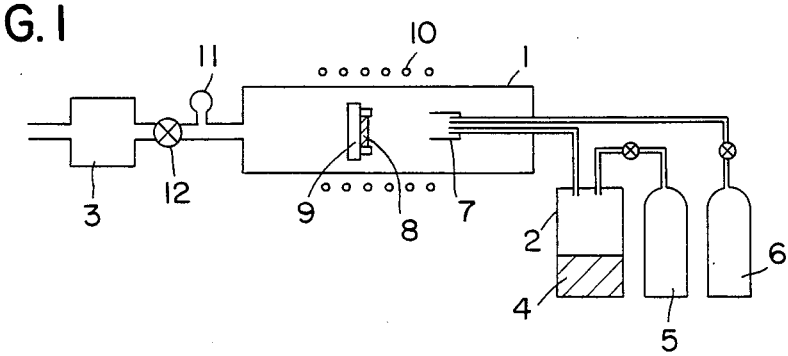
FIG. 1 is a schematic structural diagram of a plasma CVD equipment used in a manufacturing process (Example 1) according to the present invention.

A perpendicular magnetic film of spinel type iron oxide $\gamma$-$Fe_2O_3$ according to the present invention was manufactured by using a manufacturing equipment shown in FIG. 1.

This manufacturing equipment mainly comprises a tubular chamber 1, a bubbler 2 for vaporizing raw material which can be heated at a fixed temperature by a built-in heater, and an exhaust pump 3. When an organic iron compound 4 placed in the bubbler 2 is heated, the vapor of the organic iron compound is generated, and this vapor is introduced into the tubular chamber 1 by using nitrogen as a carrier gas supplied from a carrier gas cylinder 5. On the other hand, oxygen as a reaction gas from a reaction gas cylinder 6 is also introduced into the chamber 1. In the tubular chamber 1, a substrate heater 9 is disposed at the front center of a blow-off pipe 7 for blowing into the chamber the mixed gas of the vapor of the organic iron compound carried by the carrier gas of nitrogen and the reaction gas of oxygen. A substrate 8 is held on the substrate heater 9.

On the outside of the tubular chamber 1 is installed a high frequency coil 10 for generating plasma to accomplish plasma excitation of the mixed gas flowing within the tubular chamber 1. The coil 10 is excited by a high frequency power source (not shown). The exhaust pump 3 is used to maintain a fixed degree of vacuum inside of the reaction chamber 1. Denoted by 11 and 12 are a vacuum meter and a vacuum degree adjusting valve, respectively.

As the substrate 8, a 50 mm diameter circular tempered glass whose film-formed surface had been mirror finished was used. Power of iron (III) acetylacetonate ($Fe(CH_3COCHCOCH_3)_3$) of 25.0 g was placed in the bubbler 2 as the organic iron compound raw material and heated to 135°±0.5° C. and nitrogen containing 10% hydrogen was introduced as the carrier gas into the tubular chamber 1 at a flow rate of 200 ml/min. through the bubbler 2. At the same time, oxygen as the reaction gas was introduced into the same chamber at a flow rate of 10 ml/min. While introducing these gases, the exhaust system was adjusted to hold the inside of the chamber 1 at a degree of vacuum of $1.2 \times 10^{-1}$ Torr. The high frequency power was set to a fixed level of 50 W, and the plasma excitation was carried out for 20 minutes to form a CVD film on the substrate. During film forming the substrate was kept heated at 300° C.

The thus formed film was observed by the CEMS (Conversion Electron Mössbauer Spectroscopy) analysis of $Fe^{57}$ nucleus, X-ray diffraction analysis, and far-infrared spectra measurement, and it was confirmed that the produced film was a spinel type iron oxide $\gamma$-$Fe_2O_4$ thin film containing only trivalent Fe ion and the direction <111> thereof was preferentially oriented.

Generally, when the hysteresis loop of a perpendicular magnetic film is measured with a vibrating sample magnetometer (VSM), it is difficult to know the degree of perpendicular magnetization of the film because the demagnetizing field acts upon the sample film. Therefore, we used the CEMS measurement of $Fe^{57}$ nucleus by which the property of the magnetic spin can be directly known due to mutual action between the gamma rays and the magnetic spin of the magnetic iron, and determined whether the film was the perpendicular magnetic film based on the peak strength ratio of the spectra obtained.

Generally, in the case of $\gamma$-$Fe_2O_3$ of spinel type iron oxide, six peaks appear in the CEMS spectra which attribute to the trivalent Fe ion. Of these six peaks, the sum of strengths of the second and fifth peaks from the end provides information of an angle $\theta$ between the irradiating direction of the gamma rays, that is, the perpendicular direction to the surface of the sample thin film and the direction of the magnetic spin of Fe in the magnetic substance (namely, the magnetizing direction). Generally, the peak strength ratio of a spectrum is expressed by sum of the first and six peaks: sum of the second and fifth peaks:

$$\text{sum of the third and fourth peaks} = 3 : \frac{4\sin^2\theta}{1 + \cos^2\theta} : 1.$$

In the case of a film of which the direction of the magnetic spin in the magnetic film are random, the peak spectrum strength ratio of the above is 3:2:1; but in a case of a perpendicular magnetic film, the ratio is 3:0:1; while in the case of an in-plane magnetic film, the spectra peak strength ratio is 3:4:1.

This strength ratio of the sample film of the invention produced by the process described above was 3.0:0.06:1.2. Since the sum of the peak strength of the second and fifth is smaller as compared with the other two sums, it can be judged that the film is a perpendicular magnetic film.

The cross section of the obtained magnetic thin film was observed using a high resolution scanning type electron microscope. As the result of the observation, it was found that the film has a structure in which grains grow each in columnar shape perpendicularly to the film surface and that the column diameter is about 450 Å.

The experimental results of this sample film are shown on Table 1 and Table 2 as sample number 1. Results of sample films produced under varied film forming conditions are shown as sample numbers 2 through 6 on Tables 1 and 2.

Likewise, the results shown as sample numbers 7 through 18 on Tables 1 and 2 were obtained by using, as the organic iron compound, iron (III) trifluoroacetylacetonate ($Fe(CH_3COCHCOCF_3)_3$), iron (III) tetrafluoroacetylacetonate ($Fe(CF_3COCHCOCF_3)_3$), iron (III) dipivaloylmethane chelate ($Fe(C(CH_3)_3COCHCOC(CH_3)_3)_3$), ferrocene ($Fe(C_5H_5)_2$), and vinyl ferrocene.

The sample number 19 on Tables 1 and 2 is a sample for comparison different from the samples of the present invention. This comparison sample is a $\gamma$-$Fe_2O_3$ film produced by a conventional method which employs reduction and slight-oxidation processes of $\gamma$-$Fe_2O_3$ film formed by sputtering method.

As is known from Table 2, when perpendicular magnetic films of $\gamma$-$Fe_2O_3$ are obtained by controlling the film forming conditions; the film structure is columnar; the ratio of the mean column height/column diameter is 6 or more; and the column diameter is at most 550 Å for the films of preferred orientation of <111> in the direction of the axis of easy magnetization of $\gamma$-$Fe_2O_3$ film, and at most 450 Å for the films having no orientation in the direction of the axis of easy magnetization.

TABLE 1

| Sample No. | Kind of organic iron compound | Bubbler temperature (°C.) | Kind of carrier gas | Flow rate of carrier gas (ml/min.) | Flow rate of oxygen (ml/min.) | Kind of substrate | Substrate heating temperature (°C.) | Vacuum in chamber (Torr) |
|---|---|---|---|---|---|---|---|---|
| | β-diketone system | | | | | | | |
| 1 | $Fe(CH_3COCHCOCH_3)_3$ | 135 | $H_2(10\%) + N_2(90\%)$ | 20 | 10 | Glass | 300 | $1.2 \times 10^{-1}$ |
| 2 | " | 137 | " | 18.5 | " | " | 270 | $1.25 \times 10^{-1}$ |
| 3 | " | " | " | " | " | " | 305 | $1.2 \times 10^{-1}$ |
| 4 | " | 135 | " | 20 | " | " | 320 | " |
| 5 | " | " | " | 12 | 5 | " | 305 | $0.8 \times 10^{-1}$ |
| 6 | " | " | " | " | " | " | 270 | $0.7 \times 10^{-1}$ |
| 7 | $Fe(CH_3COCHCOCF_3)_3$ | 120 | " | 5 | 3 | " | 290 | $1.2 \times 10^{-1}$ |
| 8 | $Fe(CF_3COCHCOCF_3)_3$ | " | " | 4 | 2 | " | 290 | $1.2 \times 10^{-1}$ |
| 9 | " | " | " | " | " | Aluminum | 320 | $1.5 \times 10^{-1}$ |
| 10 | " | " | " | " | " | Glass | 310 | $0.8 \times 10^{-1}$ |
| 11 | " | 115 | " | " | " | " | 270 | $0.6 \times 10^{-1}$ |
| 12 | $Fe(C(CH_3)_3COCHCOC(CH_3)_3)_3$ | 140 | $H_2(8\%) + N_2(92\%)$ | 4 | 1.5 | " | 300 | $1.5 \times 10^{-1}$ |
| 13 | " | " | $H_2(10\%) + N_2(90\%)$ | " | " | " | " | " |
| | Cyclopentradienyl system | | | | | | | |
| 14 | Ferrocene($Fe(C_5H_5)_2$) | 60 | $H_2(10\%) + N_2(90\%)$ | 15 | 6 | Glass | 300 | $2.0 \times 10^{-1}$ |
| 15 | " | " | " | " | " | " | 270 | $2.1 \times 10^{-1}$ |
| 16 | " | 62 | " | " | 6.5 | " | 305 | $2.3 \times 10^{-1}$ |
| 17 | " | 60 | " | " | 4 | Aluminum | 300 | $1.3 \times 10^{-1}$ |
| 18 | Vinyl ferrocene | 90 | " | 10 | 6.5 | Glass | " | $1.2 \times 10^{-1}$ |
| 19 | r-$Fe_2O_3$ magnetic film formed by a conventional method (sample for comparison) | | | | | " | | — |

(The symbol " denotes "same as above".)

TABLE 2

| Sample No. | Kind of produced film | Result of X-ray diffraction of produced film | Film-thickness (μm) | Film structure | Column diameter (Å) (Mean value) | Column height/ diameter (Mean value) | Peak strength ratio of CEMS spectra [1st + 6th]:[2nd + 5th]:[3rd + 4th] | Perpendicular magnetic film |
|---|---|---|---|---|---|---|---|---|
| 1 | r-$Fe_2O_3$ | <111> preferred orientation | 2.00 | Columnar structure | 450 | 44 | 3.0:0.06:1.2 | o |
| 2 | " | <111> preferred orientation | 0.13 | Columnar structure | 220 | 6 | 3.0:0.07:1.1 | o |
| 3 | " | <111> preferred orientation | 1.21 | Columnar structure | 550 | 22 | 3.0:0.08:1.2 | o |
| 4 | " | <111> preferred orientation | 1.31 | Columnar structure | 650 | 20 | 3.0:1.56:1.1 | x |
| 5 | " | <100> preferred orientation | 1.00 | Columnar structure | 500 | 20 | 3.0:1.23:1.1 | x |
| 6 | " | <100> preferred orientation | 1.80 | Columnar structure | 450 | 40 | 3.0:0.08:1.2 | o |
| 7 | " | <111> preferred orientation | 1.20 | Columnar structure | 450 | 27 | 3.0:0.08:1.2 | o |

TABLE 2-continued

| Sample No. | Kind of produced film | Result of X-ray diffraction of produced film | Film-thickness (μm) | Film structure | Column diameter (Å) (Mean value) | Column height/ diameter (Mean value) | Peak strength ratio of CEMS spectra [1st + 6th]:[2nd + 5th]:[3rd + 4th] | Perpendicular magnetic film |
|---|---|---|---|---|---|---|---|---|
| 8 | " | <111> preferred orientation | 1.09 | Columnar structure | 400 | 27 | 3.0:0.03:1.2 | o |
| 9 | " | <111> preferred orientation | 0.20 | Columnar structure | 600 | 3.3 | 3.0:2.26:1.2 | x |
| 10 | " | <100> preferred orientation | 1.06 | Columnar structure | 520 | 20 | 3.0:1.30:1.1 | x |
| 11 | " | <100> preferred orientation | 1.39 | Columnar structure | 380 | 36 | 3.0:0.07:1.2 | o |
| 12 | " | <111> preferred orientation | 1.51 | Columnar structure | 470 | 32 | 3.0:0.08:1.2 | o |
| 13 | " | <111> preferred orientation | 1.51 | Columnar structure | 440 | 34 | 3.0:0.07:1.1 | o |
| 14 | " | <111> preferred orientation | 1.82 | Columnar structure | " | 41 | 3.0:0.07:1.2 | o |
| 15 | " | <111> preferred orientation | 0.26 | Columnar structure | 200 | 13 | 3.0:0:1.1 | o |
| 16 | " | <111> preferred orientation | 1.61 | Columnar structure | 800 | 20 | 3.0:1.72:1.1 | x |
| 17 | " | <111> preferred orientation | 0.24 | Columnar structure | 420 | 5.7 | 3.0:1.32:1.1 | x |
| 18 | " | <111> preferred orientation | 1.80 | Columnar structure | 400 | 45 | 3.0:0.02:1.1 | o |
| 19 | " | no orientation | — | Aggregation of uneven grains not of columnar structure | — | — | 3.0:2.32:1.2 | x |

(The symbol " denotes "same as above".)

Example 2

The manufacturing of a perpendicular magnetic film of spinel type iron oxide $Fe_3O_4$ according to the present invention was accomplished in the following manner.

The same manufacturing equipment as that used in Example 1 was used. The base substrate 8 was an aluminum circular plate having the same shape as that used in Example 1 and a mirror-finished film-formed surface, and 25.0 g of powder of iron (III) acetylacetonate was placed in the bubbler 2 as the organic metallic compound raw material. The powder was heated at 135°±0.5° C. Nitrogen as the carrier gas was supplied at a flow rate of 5 ml/min., and oxygen as the reaction gas was supplied at a flow rate of 3 ml/min. Plasma excitation and vapor deposition (VD) were accomplished while introducing the mixed gas of the above two gases into the tubular chamber 1. During the above process, the high frequency power was kept at the same fixed level of 50 W as in Example 1 and the degree of vacuum in the tubular chamber 1 was kept at $1.2 \times 10^{-1}$ Torr. The base substrate was kept heated at 280° C. thereby forming the film.

Figure 2:
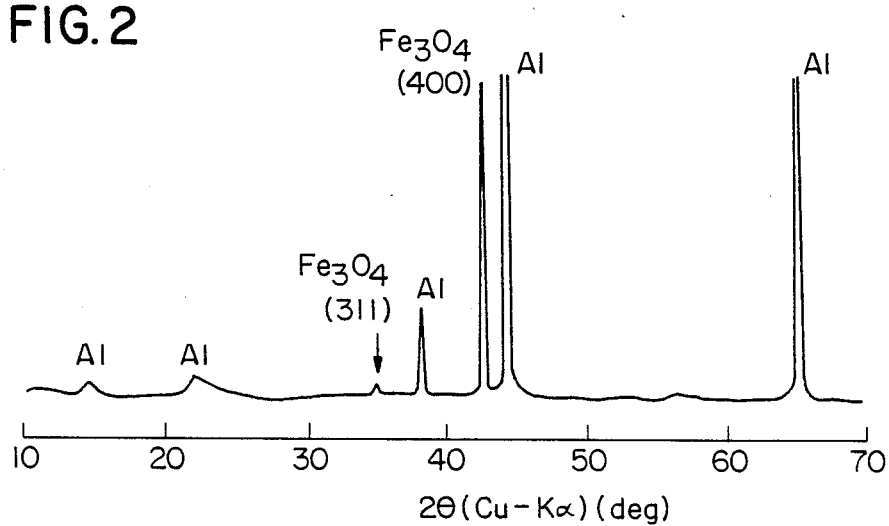
FIG. 2 is a diagram of X-ray diffraction pattern of a perpendicular magnetic film of spinel type iron oxide compound, $Fe_3O_4$, according to the present invention.

The thus obtained film was analyzed by X-ray diffraction analysis, chemical composition analysis and far-infrared spectrum measurement. As the result of the analyses, the produced film was found to be a spinel type iron oxide $Fe_3O_4$ thin film whose (100) plane was completely oriented toward the substrate surface. X-ray diffraction pattern of this film is shown in FIG. 2.

Figure 3:
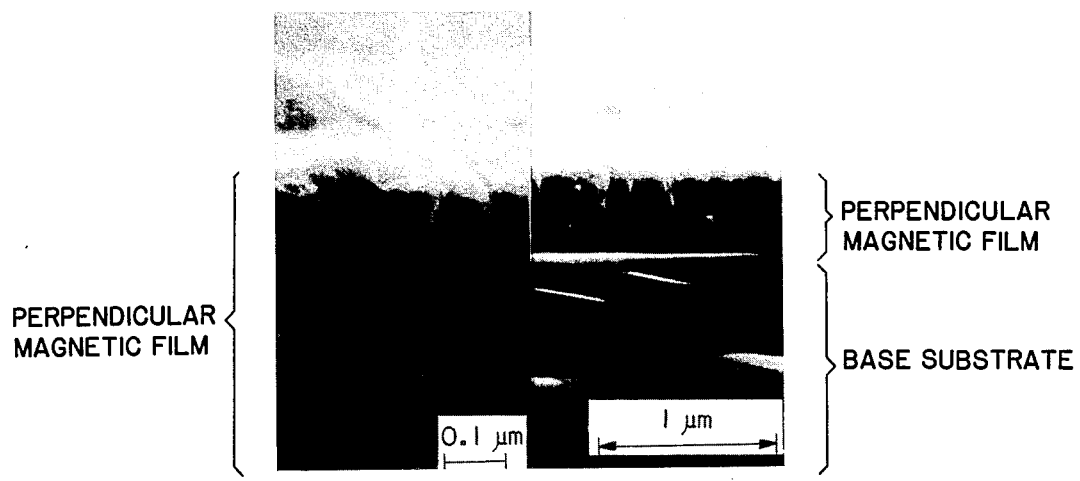
FIG. 3 is a cross sectional view of the perpendicular magnetic film of the same compound, $Fe_3O_4$.
Figure 4:
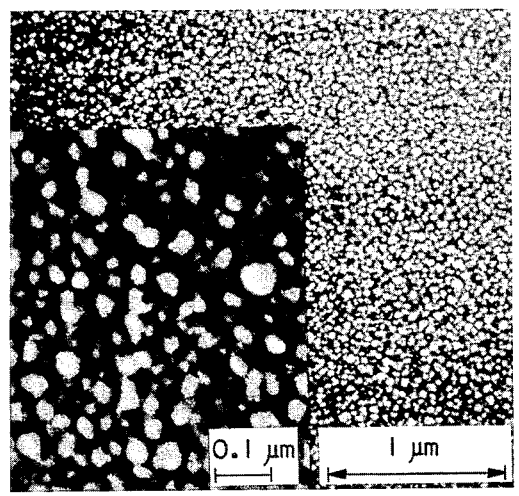

From the CEMS measurement of $Fe^{57}$ nucleus, it was known that this film contained only bivalent Fe ion and trivalent Fe ion. In addition, observation of the cross section of the film with a high resolution scanning type electron microscope revealed that the cross section was, similarly to that of sample 1 of Example 1, such that the film surface was covered with columnar grains standing densely and perpendicularly on the film surface, and further that the column diameter of each of such columnar grains was about 450 Å. FIG. 3 shows the cross section of this sample film and FIG. 4 shows the surface thereof. That is to say, by using the method according to the present invention, a spinel type iron oxide $Fe_3O_4$ film having densely arranged fine columnar grains was obtained in one process.

As to whether the obtained sample film is of a perpendicular magnetic film was judged by analyzing the $Fe^{57}$ nucleus CEMS spectra as in the case of Example 1.

Generally, the CEMS spectra of $Fe_3O_4$ show six peaks attributing to bivalent Fe iron and six peaks attributing to trivalent Fe ion, which can be separated easily into respective six peaks by computer processing. As described in connection with Example 1, with respect to each six peak spectra, it is possible to know the information of the angle $\theta$ between the irradiating direction of the gamma rays (that is, the perpendicular direction to the surface of the sample thin film) and the direction of the magnetic spin inside of the sample thin film (that is, the magnetizing direction). The strength ratio of spectra can be expressed by the following formula with respect to each of the bivalent Fe ion and trivalent Fe ion:

[sum of the first peak and six peak]:

[sum of the second peak and fifth peak]:

$$[\text{sum of the third peak and forth peak}] = 3 : \frac{4\sin^2\theta}{1 + \cos^2\theta} : 1.$$

As the tendency toward the perpendicular magnetic film increases, the strength ratio approaches to 3:0:1.

Pursuant to a calculation of this ratio with respect to the spectra of the above sample film, the result was 3.0:0.08:1.2 and it was judged that the obtained film was the perpendicular magnetic film. Observation results of this sample film are shown on Table 3 and Table 4 by numbering the film as sample No. 1. Results of the sample obtained under varied film forming conditions are shown with the sample numbers 2 through 5 on Tables 3 and 4.

As is apparent from Table 3, a perpendicular magnetic film of spinel type iron oxide, $Fe_3O_4$, can be obtained by controlling the film forming conditions.

TABLE 3

| Sample No. | Kind of organic iron compound | Bubbler temperature (°C.) | Flow rate of carrier gas (Nitrogen) (ml/min.) | Flow rate of oxygen (ml/min.) | Kind of substrate | Substrate heating temperature (°C.) | Vacuum in chamber (Torr) |
|---|---|---|---|---|---|---|---|
| | β-diketone system | | | | | | |
| 1 | $Fe(CH_3COCHCOCH_3)_3$ | 135 | 5 | 3 | Aluminum | 280 | $1.2 \times 10^{-1}$ |
| 2 | " | " | " | " | " | 310 | " |
| 3 | " | " | " | " | " | 330 | " |
| 4 | " | " | " | " | Glass | 330 | " |
| 5 | " | " | " | " | Aluminum | 280 | " |
| 6 | $Fe(CH_3COCHCOCF_3)_3$ | 120 | 4 | 2 | " | " | " |
| 7 | $Fe(CF_3COCHCOCF_3)_3$ | " | " | " | " | " | " |
| 8 | $Fe(C(CH_3)_3COCHCOC(CH_3)_3)_3$ | 140 | " | 1.5 | " | " | " |
| | Cyclopenta dienyl system | | | | | | |
| 9 | Ferrocene($Fe(C_5H_5)_2$) | 60 | 15 | 6 | " | " | $1.0 \times 10^{-1}$ |
| 10 | " | " | " | " | " | 300 | " |
| 11 | " | " | " | " | " | 320 | " |
| 12 | Vinyl ferrocene | 90 | 10 | 6.5 | " | 280 | $1.5 \times 10^{-1}$ |
| 13 | $Fe_3O_4$ film formed by sputtering method (Sample for comparison) | | | | | 400 | $3.0 \times 10^{-1}$ |

(The symbol " denotes "same as above".)

TABLE 4

| Sample No. | Kind of produced film | Result of X-diffraction of produced film | Film-thickness (μm) | Film structure | Column diameter (Å) (Mean value) | Column height/diameter (Mean value) | Peak strength ratio of CEMS spectra [1st + 6th]:[2nd + 5th]:[3rd + 4th] | Perpendicular magnetic film |
|---|---|---|---|---|---|---|---|---|
| 1 | $Fe_3O_4$ | <100> preferred orientation | 0.4 | Columnar structure | 450 | 9 | 3.0:0.10:1.1 | o |
| 2 | " | <100> preferred orientation | 1.1 | Columnar structure | 550 | 20 | 3.0:1.80:1.1 | x |
| 3 | " | <100> preferred orientation | 0.8 | Columnar structure | 850 | 9.4 | 3.0:2.10:1.2 | x |
| 4 | " | <100> preferred orientation | " | Columnar structure | 800 | 10 | 3.0:1.93:1.2 | x |
| 5 | " | <100> preferred orientation | 0.2 | Columnar structure | 450 | 4.5 | 3.0:2.50:1.0 | x |
| 6 | " | <100> preferred orientation | 0.8 | Columnar structure | 400 | 20 | 3.0:0.07:1.1 | o |
| 7 | " | <100> preferred orientation | " | Columnar structure | 430 | 18 | 3.0:0.09:1.2 | o |
| 8 | " | <100> preferred orientation | " | Columnar structure | 400 | 20 | 3.0:0.07:1.2 | o |
| 9 | " | <100> preferred orientation | 1.0 | Columnar structure | 320 | 31 | 3.0:0.03:1.2 | o |
| 10 | " | <100> preferred orientation | 1.05 | Columnar structure | 450 | 23 | 3.0:0.06:1.1 | o |
| 11 | " | <100> preferred orientation | 1.0 | Columnar structure | 700 | 14 | 3.0:1.55:1.1 | x |
| 12 | " | <100> preferred orientation | " | Columnar structure | 320 | 31 | 3.0:0.05:1.2 | o |
| 13 | " | <111> preferred orientation | 1.2 | Columnar structure | 850 | 14 | 3.0:1.75:1.2 | x |

(The symbol " denotes "same as above".)

When, instead of the above iron (III) acetylacetonate used for sample No. 1, iron (III) trifluoroacetylacetonate, iron (III) hexafluoroacetylacetonate, iron (III) dipivaloylmethane chelate, ferrocene and vinyl ferrocene were used as organic metallic compounds, and the plasma asisted CVD processes were accomplished under the conditions shown on Table 3, $Fe_3O_4$ perpendicular magnetic films each having the same film structure as that of sample No. 1 were obtained. The column diameters of columnar grains ranged from 300 to 450 Å. Results of the films obtained are shown as sample numbers 6 through 12 on Tables 3 and 4. The sample numbered as sample No. 13 is an $Fe_3O_4$ film manufactured by sputtering method and by using the $Fe_3O_4$ sintered target as a comparative sample.

Example 3

Figure 5:
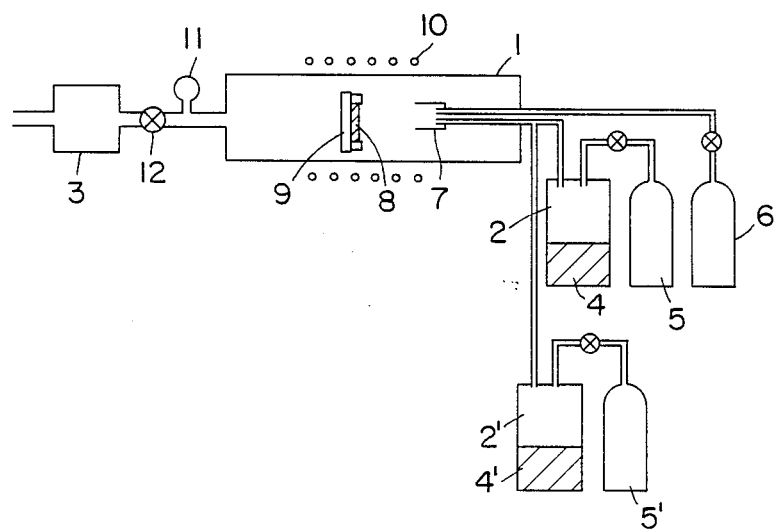
FIG. 5 is a schematic structural diagram of another plasma CVD equipment used in a manufacturing process (Example 3) according to the present invention.

As a base substrate 8, a tempered circular glass having a film formed surface mirror-finished similar to that used in Example 1 was used, a manufacturing equipment of a structure as shown in FIG. 5 was used, and the base substrate was kept heated at 300° C. Bubblers 2, 2' are for having placed therein raw materials 4, 4' and carrier gas cylinders 5, 5' are for supplying carrier gases at different flow rates from each other. As the organic metallic compound raw material, organic iron compound and organic cobalt compound were used. As the organic iron compound, iron (III) acetylacetonate was used, and as the organic cobalt compound, cobalt acetylacetonate was used. The raw materials each in quantity of 25.0 g were placed in the bubblers 2 and 2' respectively. By flowing the carrier gas ($N_2$) at different flow rates from the cylinders 5, 5' through the bubblers 2, 2', vapors of the respective raw materials having different flow rates were introduced into the tubular chamber 1 through the pipe 7. Inside each of the bubblers was heated and held at a fixed temperature of 135°±0.5° C., the degree of vacuum in the tubular chamber was held at $1.2 \times 10^{-2}$ Torr, and the high frequency power of 50 W was maintained, whereby the plasma excitation and CVD were accomplished to form films. Table 5 shows the film forming conditions of each of the manufactured magnetic films as sample numbers 1 through 4.

With respect to each of the films formed on the substrate of tempered glass obtained in the above manner, measurements were made by X-ray diffraction analysis, chemical composition analysis, far-infrared absorbed spectrum measurement, and $Fe^{57}$ CEMS and observation was carrier out using a high resolution scanning type electron microscope. As the result, it was found that the film structure in every case was similar to that shown in FIG. 3 of Example 2, and the column diameter of fine columnar grains of this film was in the range from 300 to 550 Å.

In terms of crystalline structure, each of the film was an iron oxide $Co_xFe_{3-x}O_4$ having a solid solution of spinel type Co contained therein in a small amount, in which all the <111> planes were oriented in parallel to the surface of the base substrate.

As to whether the obtained sample films were each a perpendicular magnetic film, judgement were made by checking the strength ratio of the respective six peaks attributing to bivalent Fe ion and trivalent Fe ion of the $Fe^{57}$ nucleus CEMS spectra, as in the case of Example 2. As shown on Table 6, because the samples numbered from 1 through 4 indicate no absorption at the second and fifth spectra, it is clear that all the obtained films are perpendicular magnetic films.

With regard to the organic iron (III) compound, even if other compounds such as β-diketone iron (III) hexafluoroacetylacetonate, and cyclopentadienyl ferrocene were used instead of the above iron (III) acetylacetonate, the same $Co_xFe_{3-x}O_4$ films were manufactured by controlling the temperature of the bubbler where these raw materials are placed. With regard to the organic cobalt compound, even if such compound as another β-diketone compound such as cobalt trifluoroacetylacetonate and cyclopentadienyl compound such as cobaltcen were used instead of the above cobalt acetylacetonate, the same $Co_xFe_{3-x}O_4$ films as the above were manufactured when the bubbler temperature was controlled in a similar manner as the above and the flow rate of the vapor was properly adjusted. Results of these are shown as sample numbers 5 through 8 on Tables 5 and 6.

For sample numbers 9 through 11, iron (III) acetylacetonate was used as the organic compound while nickel acetonate, manganese acetylacetonate and zinc acetylacetonate were used as another organic metallic compound to obtain spinel type iron oxide compound thin films. It is understood that all films manufactured in the above process are perpendicular magnetic films.

For the purpose of comparison, the same plasma CVD method was used, and the temperature of the base substrate was increased above 320° C., so that sample films whose column diameters were caused to grow large were manufactured. Results of these comparison samples are shown as sample numbers 12 through 16 on Tables 5 and 6. It can be known from Table 6 that perpendicular magnetic films were not obtained in either of these comparison samples.

With further respect to the thin film of cobalt substituted spinel type iron oxide, thin films manufactured by conventional sputtering method and solution spray-dry pyrolysis method were used as samples for comparison. The results are shown as sample numbers 17 and 18 on Tables 5 and 6. For the sample obtained by the sputtering method, sintered $Co_{0.8}Fe_{2.2}O_4$ of cobalt substituted spinel type iron oxide was used as a target material and the film was formed in vacuum of $4.5 \times 10^{-3}$ Torr and at the substrate temperature of 400° C. For the sample obtained by the solution spray-dry pyrolysis method, alcohol solution containing both $Fe(NO_3)_3$ of 0.02 mol/l and $Co(NO_3)_2$ of 0.01 mol/l was coated over the sample while rotating the substrate. After heat treatment at 300° C., subsequent 30 cycles of coating and heat treatment processes were repeated, and then the film was again heat-treated at a high temperature of 650° C.

TABLE 5

| Sample No. | Organic iron compound Kind | Bubbler temperature (°C.) | Carrier gas Kind | Carrier gas Flow rate (ml/min.) | Organic metallic compound Kind | Bubbler temperature (°C.) |
|---|---|---|---|---|---|---|
| 1 | $Fe(CH_3COCHCOCH_3)_3$ | 135 | $N_2$ | 10 | $Co(CH_3COCHCOCH_3)_3$ | 135 |
| 2 | " | " | " | " | " | " |
| 3 | " | " | " | " | " | " |
| 4 | " | " | " | " | " | " |
| 5 | $Fe(CF_3COCHCOCF_3)_3$ | 120 | " | 4 | " | " |
| 6 | $Fe(C_5H_5)_2$ | 60 | " | 15 | " | 110 |
| 7 | $Fe(CH_3COCHCOCH_3)_3$ | 135 | " | 10 | $Co(CF_3COCHCOCF_3)_3$ | 110 |
| 8 | " | " | " | " | $Co(C_5H_5)_2$ | 80 |
| 9 | " | " | " | " | $Ni(CH_3COCHCOCH_3)_2$ | 145 |
| 10 | " | " | " | " | $Mn(CH_3COCHCOCH_3)_2$ | 135 |
| 11 | " | " | " | " | $Zn(CH_3COCHCOCH_3)_2$ | 100 |
| 12 | " | " | " | " | $Co(CH_3COCHCOCH_3)_3$ | 135 |
| 13 | $Fe(C_5H_5)_2$ | 60 | " | 15 | " | " |
| 14 | $Fe(CH_3COCHCOCH_3)_3$ | 135 | " | 10 | " | " |
| 15 | $Fe(CH_3COCHCOCH_3)_3$ | 135 | $N_2$ | 10 | $Co(CH_3COCHCOCH_3)_3$ | 110 |
| 16 | " | " | " | " | $Ni(CH_3COCHCOCH_3)_3$ | 145 |
| 17 | Cobalt substituted iron oxide film formed by sputtering method (Sample for comparison) | | | | | |
| 18 | Cobalt substituted iron oxide film formed by solution spray-dry pryolysis method (Sample for comparison) | | | | | |

| Organic metallic compound | Vacuum |
|---|---|

TABLE 5-continued

| Sample No. | Carrier gas Kind | Flow rate (ml/min.) | Flow rate of oxygen (ml/min.) | Substrate Kind | Temperature (°C.) | in chamber (Torr) |
|---|---|---|---|---|---|---|
| 1 | $N_2$ | 1 | 12 | Glass | 300 | $1.2 \times 10^{-2}$ |
| 2 | " | 2 | " | " | " | " |
| 3 | " | 3 | " | " | " | " |
| 4 | " | 5 | " | " | " | " |
| 5 | " | 4 | " | " | " | $1.1 \times 10^{-2}$ |
| 6 | " | 5 | 20 | " | 290 | $1.0 \times 10^{-1}$ |
| 7 | " | " | 15 | " | 300 | $1.5 \times 10^{-2}$ |
| 8 | " | " | " | " | 290 | $3.0 \times 10^{-2}$ |
| 9 | " | 2 | 12 | " | " | $1.0 \times 10^{-2}$ |
| 10 | $H_2(8\%) + N_2(92\%)$ | 1 | " | " | " | $1.2 \times 10^{-2}$ |
| 11 | " | 2 | " | " | " | $1.8 \times 10^{-2}$ |
| 12 | $N_2$ | 3 | " | " | 320 | $1.2 \times 10^{-2}$ |
| 13 | " | 5 | 20 | " | 330 | $0.9 \times 10^{-1}$ |
| 14 | " | 3 | 12 | Aluminum | 320 | $1.2 \times 10^{-2}$ |
| 15 | $N_2$ | 3 | 12 | Glass | 320 | $1.2 \times 10^{-2}$ |
| 16 | " | 2 | " | " | " | " |
| 17 | | | | " | 400 | $4.5 \times 10^{-1}$ |
| 18 | | | | " | — | — |

(The symbol " denotes "same as above".)

TABLE 6

| Sample No. | Kind of produced film | Result of X-ray diffraction of produced film | Film-thickness (μm) | Film Structure | Column diameter (Å) (Mean value) | Column height/ diameter (Mean value) | Peak strength ratio of CEMS spectra [1st + 6th]:[2nd + 5th]:[3rd + 4th] | Perpendicular magnetic film |
|---|---|---|---|---|---|---|---|---|
| 1 | $Co_{0.3}Fe_{2.7}O_4$ | <100> preferred orientation | 0.8 | Columnar structure | 450 | 17 | 3.0:0.07:1.1 | o |
| 2 | $Co_{0.3}Fe_{2.5}O_4$ | <100> preferred orientation | 0.25 | Columnar structure | 420 | 6 | 3.0:0.13:1.2 | o |
| 3 | $Co_{0.8}Fe_{2.2}O_4$ | <100> preferred orientation | 0.3 | Columnar structure | 380 | 8 | 3.0:0.04:1.1 | o |
| 4 | $Co_{0.9}Fe_{2.1}O_4$ | <100> preferred orientation | " | Columnar structure | 330 | 9 | 3.0:0.02:1.1 | o |
| 5 | $Co_{0.8}Fe_{2.2}O_4$ | <100> preferred orientation | 1.2 | Columnar structure | 350 | 34 | 3.0:0.05:1.1 | o |
| 6 | $Co_{1.0}Fe_{2.0}O_4$ | <100> preferred orientation | 1.6 | Columnar structure | 250 | 64 | 3.0:0:1.1 | o |
| 7 | " | <100> preferred orientation | 1.2 | Columnar structure | 380 | 31 | 3.0:0.07:1.2 | o |
| 8 | $Co_{0.6}Fe_{2.4}O_4$ | <100> preferred orientation | 0.8 | Columnar structure | 400 | 20 | —3.0:0.09:1.2 | o |
| 9 | $Ni_{0.3}Fe_{2.7}O_4$ | <100> preferred orientation | 1.0 | Columnar structure | 350 | 28 | 3.0:0.10:1.2 | o |
| 10 | $Mn_{0.2}Fe_{2.8}O_4$ | <100> preferred orientation | " | Columnar structure | 350 | 28 | 3.0:0.07:1.2 | o |
| 11 | $Zn_{0.3}Fe_{3.7}O_4$ | <100> preferred orientation | " | Columnar structure | 300 | 33 | 3.0:0.09:1.1 | o |
| 12 | $Co_{0.8}Fe_{2.2}O_4$ | <100> preferred orientation | 1.8 | Columnar structure | 700 | 25 | 3.0:1.45:1.2 | x |
| 13 | $Co_{0.2}Fe_{2.8}O_4$ | <100> preferred orientation | " | Columnar structure | 1050 | 17 | 3.0:1.92:1.2 | x |
| 14 | $Co_{0.8}Fe_{2.2}O_4$ | <100> preferred orientation | 1.3 | Columnar structure | 700 | 18 | 3.0:1.72:1.2 | x |
| 15 | $Co_{0.6}Fe_{2.4}O_4$ | <100> preferred orientation | 1.5 | Columnar structure | 900 | 16 | 3.0:1.75:1.2 | x |
| 16 | $Ni_{0.3}Fe_{2.7}O_4$ | <100> preferred orientation | 0.8 | Columnar structure | 950 | 8.4 | 3.0:2.03:1.2 | x |
| 17 | $Co_{0.8}Fe_{2.2}O_4$ | <111> preferred orientation | 0.7 | Columnar structure | 1000 | 7 | 3.0:1.92:1.2 | x |
| 18 | $Co_{1.0}Fe_{2.0}O_4$ | <100> preferred orientation | 0.85 | Aggregation of random grains | — | — | 3.0:0.40:1.2 | o |

(The symbol " denotes "same as above".)

What is claimed is:

1. A perpendicular magnetic film formed on a surface of a base structure in the form of a columnar grains which are densely arranged perpendicularly to the surface of the base substrate, said film consisting of an iron oxide compound having a spinel crystal structure selected from the group consisting of $\gamma$-$Fe_2O_3$, $Fe_3O_4$ and $M_xFe_{3-x}O_4$, where M is a metal selected from the group consisting of Co, Ni, Mn and Zn and x is in the range of $0.25 \leqq x \leqq 1.0$.

2. The perpendicular magnetic film according to claim 1, wherein the mean height-diameter ratio of the columnar grains is at least 6 and the column diameter of each grain is at most 450 Å.

3. A perpendicular magnetic film formed on a surface of a base substrate in the form of columnar grains which are densely arranged perpendicularly to the surface of the base substrate, said film consisting of $\gamma$-$Fe_2O_3$ grown in the <111> direction perpendicularly to the surface of the base substrate.

4. The perpendicular magnetic film according to claim 3, wherein the mean height/diameter ratio of the columnar grains is at least 6 and the column diameter of each grain is at most 550 Å.

5. A perpendicular magnetic film formed on a surface of a base substrate in the form of columnar grains which are densely arranged perpendicularly to the surface of the base substrate, said film consisting of $Co_xFe_{3-x}O_4$, where $0.3 \leqq x \leqq 1.0$.

6. The perpendicular magnetic film according to claim 5, wherein $Co_xFe_{3-x}O_4$ is grown in the <100> direction perpendicularly to the surface of the base structure.

7. The perpendicular magnetic film according to claim 6, wherein the mean height/diameter ratio of the columnar grains is at least 6 and the column diameter of each grain is at most 450 Å.

* * * * *